(12) United States Patent
Lin

(10) Patent No.: US 8,525,572 B2
(45) Date of Patent: Sep. 3, 2013

(54) LEVEL-UP SHIFTER CIRCUIT

(75) Inventor: David Lin, Westborough, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 13/369,652

(22) Filed: Feb. 9, 2012

(65) Prior Publication Data

US 2012/0206180 A1   Aug. 16, 2012

Related U.S. Application Data

(60) Provisional application No. 61/442,973, filed on Feb. 15, 2011.

(51) Int. Cl.
*H03L 5/00*   (2006.01)
(52) U.S. Cl.
USPC ................. 327/333; 326/80; 326/81
(58) Field of Classification Search
USPC ..................... 327/333; 326/80, 81
See application file for complete search history.

(56) References Cited

U.S. PATENT DOCUMENTS

| | | | |
|---|---|---|---|
| 7,564,288 B2 * | 7/2009 | Seki et al. | 327/333 |
| 7,567,111 B2 * | 7/2009 | Seki et al. | 327/333 |
| 7,839,171 B1 * | 11/2010 | Miles et al. | 326/80 |
| 7,855,575 B1 * | 12/2010 | Hsu et al. | 326/80 |
| 7,884,644 B1 * | 2/2011 | Wu et al. | 326/68 |
| 7,884,645 B2 * | 2/2011 | Chen et al. | 326/81 |
| 8,044,683 B2 * | 10/2011 | Jung et al. | 326/81 |
| 8,102,199 B2 * | 1/2012 | Chou et al. | 327/333 |
| 8,217,703 B2 * | 7/2012 | Hurrell | 327/333 |
| 8,258,848 B2 * | 9/2012 | Chen | 327/333 |
| 8,334,709 B2 * | 12/2012 | Kuge | 326/63 |
| 8,339,177 B2 * | 12/2012 | Jarrar et al. | 327/333 |

* cited by examiner

*Primary Examiner* — Kenneth B. Wells
(74) *Attorney, Agent, or Firm* — Hamilton, Brook, Smith & Reynolds, P.C.

(57) ABSTRACT

A level-up shifter circuit is suitable for high speed and low power applications. The circuit dissipates almost no static power, or leakage current, compared to conventional designs and can preserve the signal's duty cycle even at high data rates. This circuit can be used with a wide range of power supplies while maintaining operational integrity.

18 Claims, 5 Drawing Sheets

LEVEL-UP SHIFTER CIRCUIT

RELATED APPLICATION

This application claims the benefit of U.S. Provisional Application No. 61/442,973, filed on Feb. 15, 2011. The entire teachings of the above application are incorporated herein by reference.

BACKGROUND

A level-up shifter is an essential element for IO design which handles signals crossing from the core power supply domain to the IO power supply domain, with the IO supply higher than the core supply. For the full-swing GHz high speed signals, a level-up shifter which can handle rail to rail signal level and still preserve duty cycle fidelity is in high demand. More importantly, as power dissipation becomes an important factor in IC design, it is critical to reduce DC current paths. Since a level-up shifter needs to transfer signals from one power domain to another, short-circuit currents may still be present when driving a static DC level if not designed carefully, particularly as the difference between core and IO supply grows larger.

SUMMARY

Example embodiments of the invention provide a level-up shifter circuit suitable for high speed and low power applications. This circuit design dissipates minimal or negligible static power, or leakage current, compared to conventional designs and can preserve the signal's duty cycle even at high data rates. This circuit can be used with a wide range of power supplies while maintaining operational integrity.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
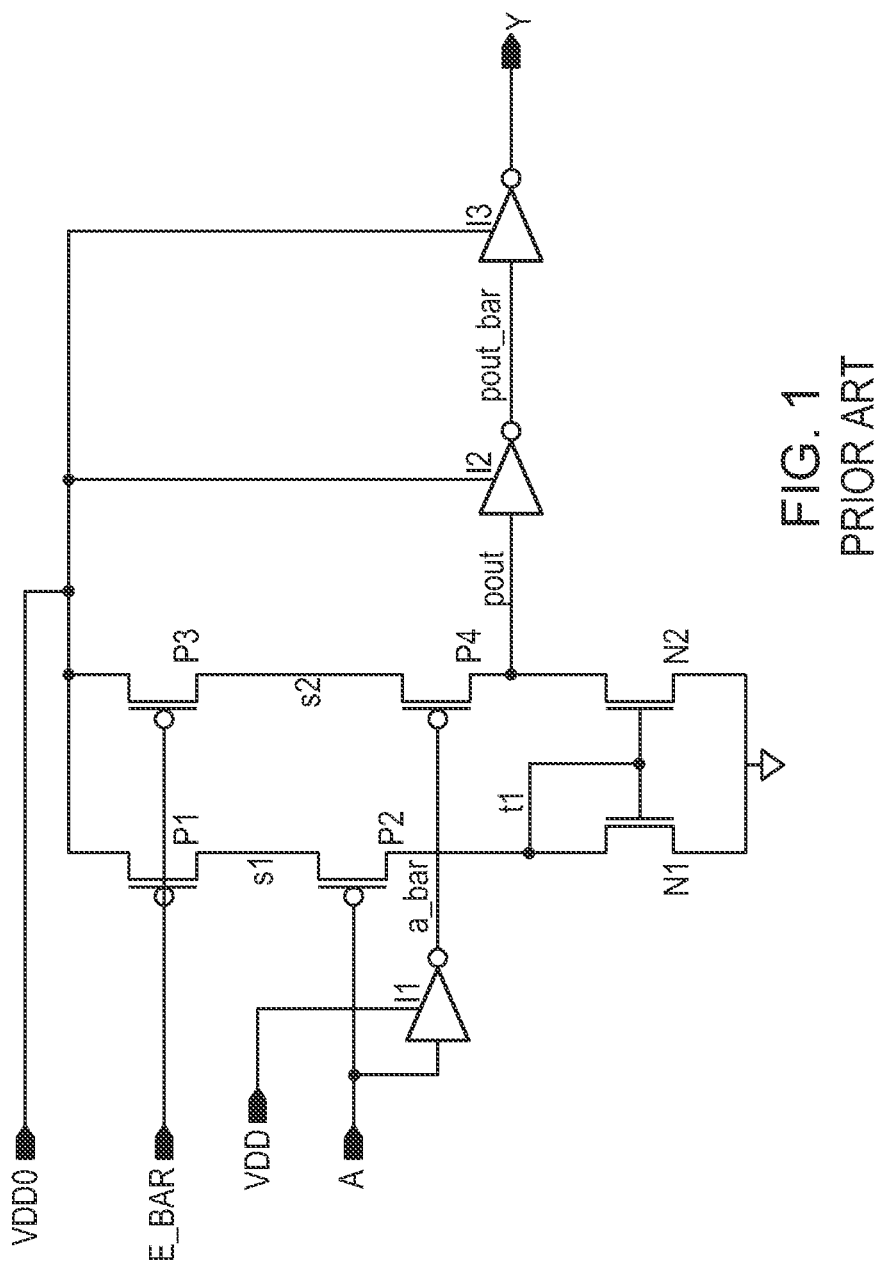
FIG. 1 is a circuit diagram of a typical level-up shifter circuit.

FIG. 1 is a circuit diagram of a typical level-up shifter circuit. Conventional level-up shifters have been implemented in high-speed signals interfacing between the core power domain and the IO power domain. As shown in FIG. 1, pin A is the input signal and is in the core power domain, indicated as pin VDD. A buffer (e.g., an inverter) receives the input signal, which is the signal that is to be shifted up to the IO power domain, indicated as VDDO pin. Pin E_BAR is the enable signal that enables the function of this level-up shifter if E_BAR=0. Pin Y is the output signal being shifted up.

Logically, the conventional shifter design of FIG. 1 appears to operate to output an up-shifted signal corresponding to the input at pin A. However, in actual implementation, there is an inevitable DC current path from VDDO to ground either through PFET P1, P2 and NFET N1, or through PFET P3, P4 and NFET N2. Given inputs A=1, E_BAR=0, and VDD<VDDO, for example, logically PFET P2 should be shut off and PFET P4 should be turned on and both P1 and P3 should be on as well, therefore producing a logical 1 on the Y pin. However, due to the difference between voltage level of VDD and VDDO, a logical 1 in VDD may not necessarily mean a logical 1 in the VDDO domain. If the difference between VDD and VDDO is greater than the threshold voltage of PFET, which is Vgs<Vth (both Vgs and Vth are negative since this is for PFET), then PFET P2 is being turned on, and causes node t1 to be raised above 0v. Depending on the difference between VDD and VDDO, node t1 can be raised higher than the threshold voltage of NFET, and causes NFET N1 and N2 to be turned on as well. Once NFET N1 and N2 are on, it would create a DC current path from VDDO to ground. This is undesirable leakage current that happens constantly. This effect is referred to as static power dissipation. Even if the difference between VDD and VDDO is not high enough to be above the threshold voltage of PFET, the PFET could still be in the sub-threshold region, and a small amount of leakage current is still inevitable.

To minimize the DC current, transistors P1 and P3 can be configured such that there are two-high stacks PFETs. Even though E_BAR is intended to be a feature to enable or disable the level-up shifter, E_BAR=logical 1 is not really capable of shutting off P1 and P3 completely as E_BAR is a signal in VDD domain. PFETs P1 and P3 are also subject to the Vgs vs Vth relationship as well. Because of this constraint, this design is only suitable for the application in which the VDD and VDDO difference is not that high. Even in situations where VDD and VDDO are close, it is still susceptible to sub-threshold leakage current if there is a finite difference between them that creates a non-zero Vgs on the PFETs.

Figure 2:
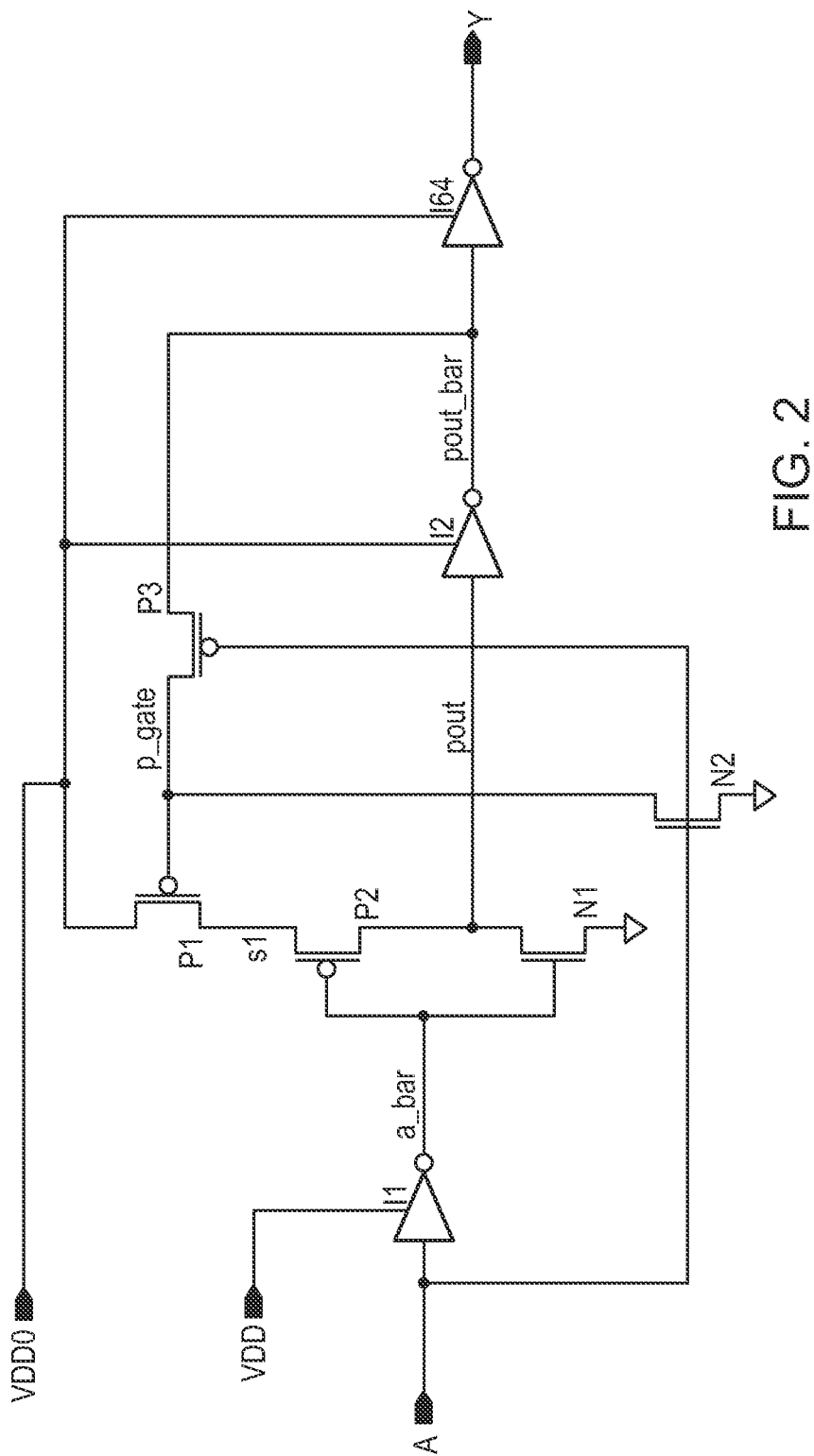
FIG. 2 is a circuit diagram of a level-up shifter circuit in an example embodiment.

FIG. 2 is a circuit diagram of a level-up shifter circuit in an example embodiment. Here, the level-up shifter comprises one fewer MOSFET than the circuit of FIG. 1, and completely shuts off the DC path from VDDO to ground when transmitting either logical 1 or 0. With proper device sizing, this design can produce a near ideal 50-50 duty cycle waveform at its output even over process, voltage and temperature (PVT) variation at high speed. Operation of the level-up shifter of FIG. 2 is described in further detail below with reference to FIG. 2.

Figure 3:
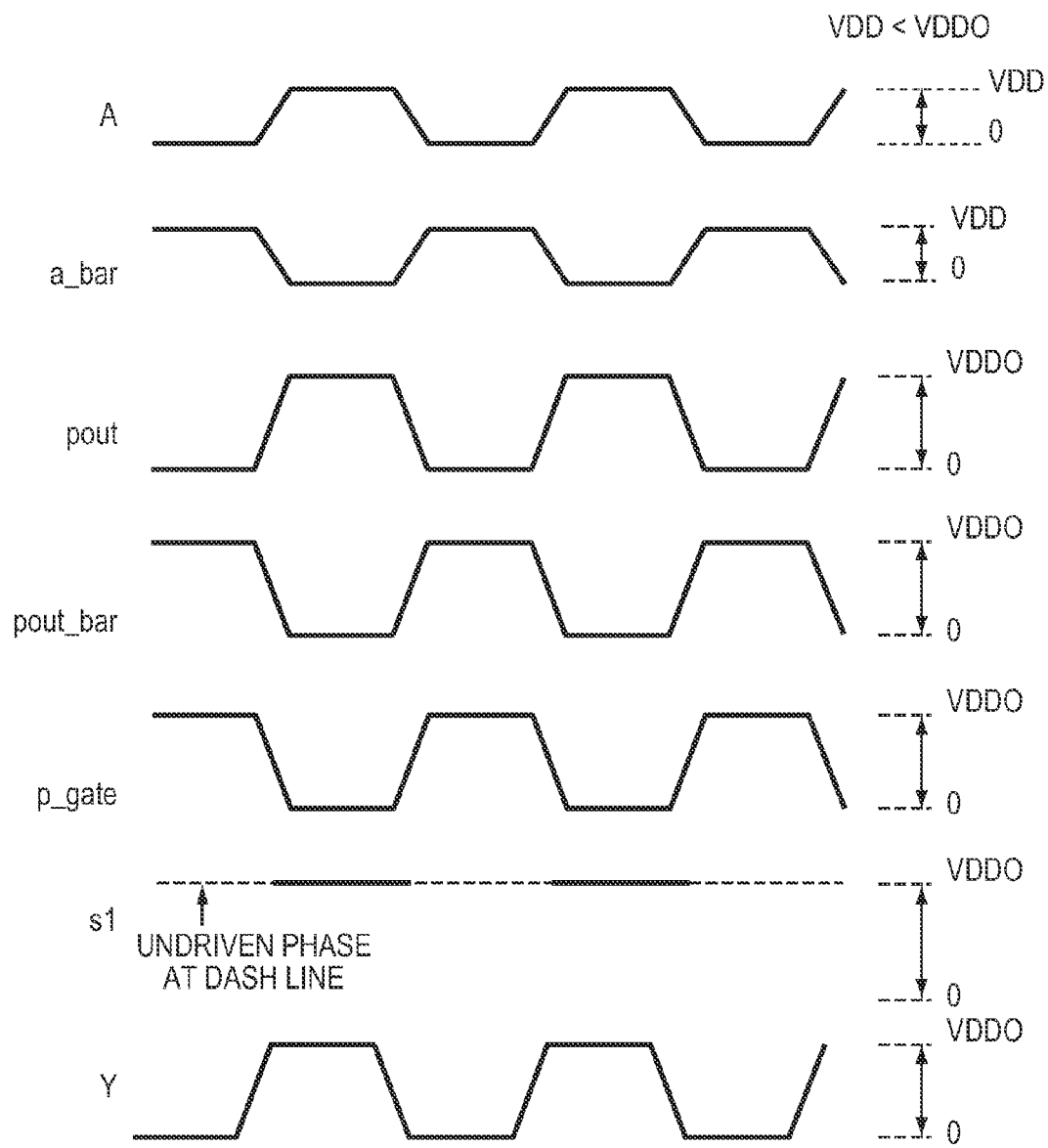
FIG. 3 is a timing diagram of the level-up shifter circuit of FIG. 2.

FIG. 3 is a timing diagram of the level-up shifter circuit of FIG. 2 under operation. When A=logical 1 and VDD<VDDO, NFET N2 is turned on and PFET P3 is turned off, therefore node p_gate is pulled down to ground by N2. Since node p_gate is now at logical 0, PFET P1 is turned on subsequently. Meanwhile, node a_bar becomes logical 0 so PFET P2 is then turned on and NFET N1 is turned off completely. At this state, node pout is charged to VDDO through PFET P1 and P2, and it is certain that there is no DC path from node pout to ground since NFET N1 is turned off when its gate is driven by logical 0. Because node pout is now at VDDO, node pout_bar becomes logical 0 and output node Y becomes logical 1 (VDDO) as a result. Since both source and drain of PFET P3 is now at logical 0 and gate of P3 at VDD, there is no current flowing through P3 either.

When A=logical 0 and VDD<VDDO, NFET N2 is turned off and the gate of PFET P3 is driven to logical 0. P3 is going to be turned on depending on the Vgs level, which is if node pout_bar rises above the threshold voltage of P3. Meanwhile, node a_bar is at logical 1 or VDD, and therefore NFET N1 is turned on completely and the condition of PFET P2 being off depends on the Vgs, or the voltage difference between node s1 and a_bar. With N1 being on, it pulls node pout to ground and turns node pout_bar to logical 1 (VDDO) subsequently. With node pout_bar raises from 0 to VDDO, node p_gate is tracked with it as well, and as a result it completely turns off PFET P1. Since Vgs of P1 is now at 0v, the current flowing through the source and drain of P1 is eliminated. At this point, output node Y is driven to logical 0 and there is no DC current from VDDO to ground in this scenario either.

Figure 4:
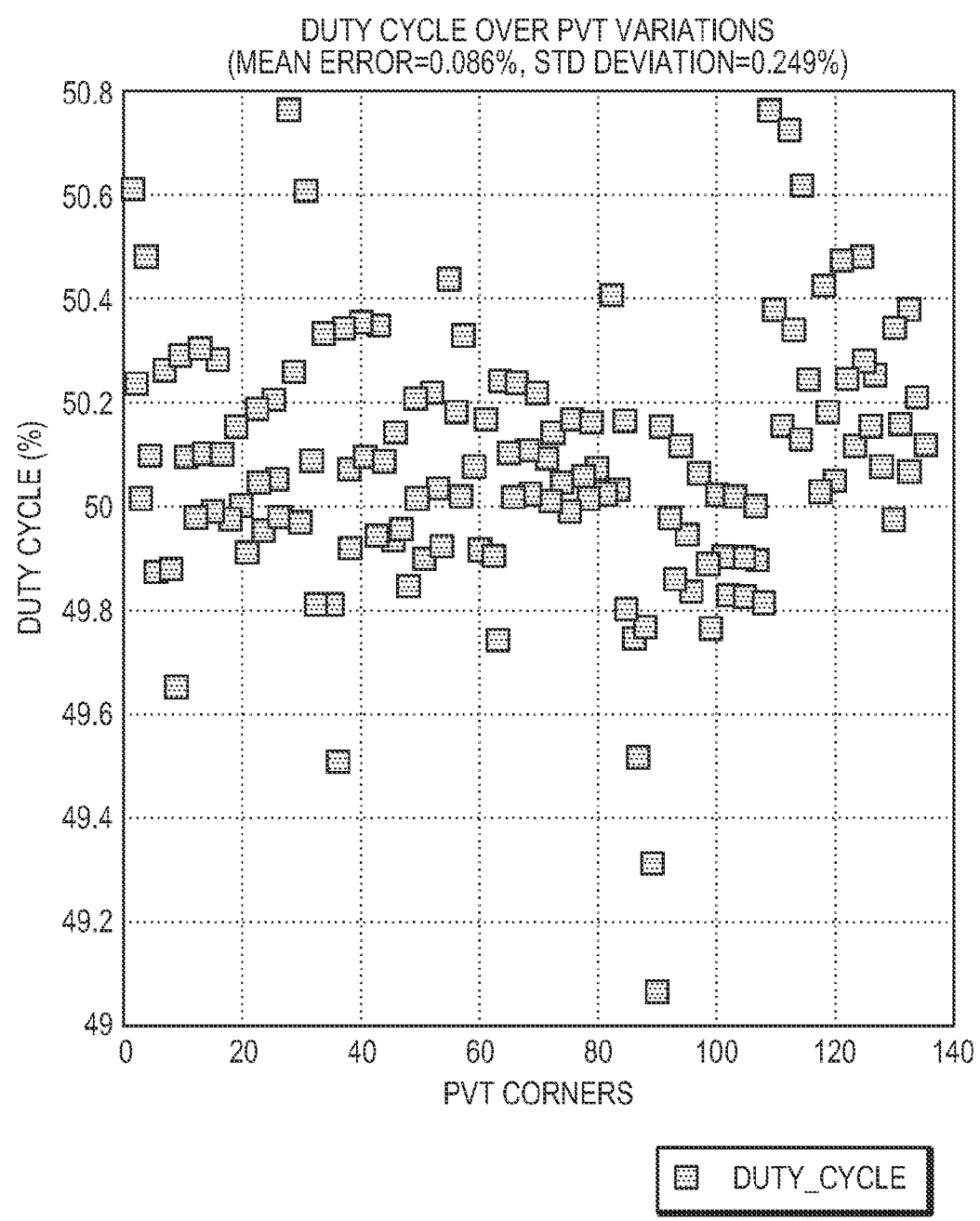
FIG. 4 is a chart of simulated duty cycles over PVT variations.

FIG. 4 is a chart of simulated duty cycles over PVT variations. To demonstrate the robustness of this level-up shifter, a VDD vs VDDO combination may be simulated as described below. With proper device sizing, this circuit can also be used with different VDD vs VDDO combinations. In this case, a nominal VDD voltage at 1.1v and a nominal VDDO voltage at 1.5 v are used for simulations. To further stress this circuit, the following process, voltage and temperature (PVT) variations are used to come up 135 corner simulations: the process is swept through TT, FF, SS, SF, and FS corners; the VDD voltage is varied from 0.9v, 1.1v to 1.225v; the VDDO voltage is tested with 1.4v, 1.5v and 1.6v; and the temperature is varied from −40° C., 60° C., to 110° C. Over such extreme PVT variations, the example data of FIG. 4 demonstrates that the level-up shifter of FIG. 2 still maintains excellent duty cycle fidelity. The ideal goal is to achieve a duty cycle with 50%, and this circuit maintains the mean duty cycle at 50.086%, with standard deviation of ±0.249%.

Figure 5:
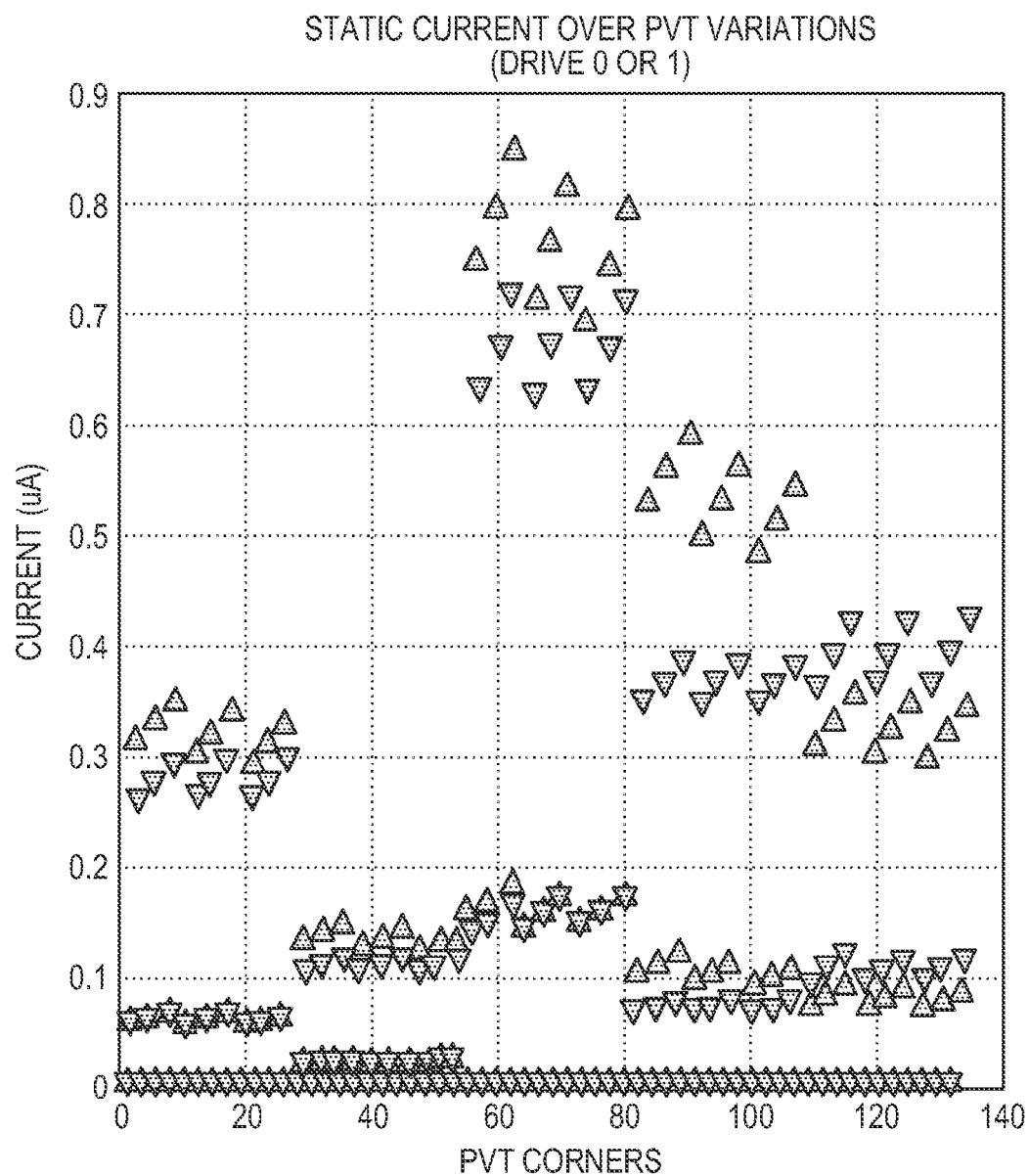
FIG. 5 is a chart of simulated static current over PVT variations.

FIG. 5 is a chart of simulated static current over PVT variations. In terms of power consumption, unlike the conventional high speed level-up shifter, the level-up shifter of FIG. 2 consumes almost no DC current or static current when driving a constant logical 0 or logical 1. FIG. 5 demonstrates that, over the same PVT variations applied as shown in FIG. 4, the circuit only dissipates 0.85 uA of current as a worst case, which is almost no DC current at all. This means this level-up shifter will not consume any static power when in standby mode or driving a logical 0 or logical 1. Therefore, it also eliminates the requirement of having an enable function as prior art does.

Example embodiments provide a significant power improvement on static power dissipation, especially if it is being used on parallel IO interfaces. Any static power reduction on a single circuit entity can easily be multiplied by a big multiplication factor for a large number of instances being used. At the same time, the level-up shifter still meets the high speed requirement that delivers an acceptable 50-50 duty cycle over extreme PVT variations. In addition, the mechanism that shuts off DC current has no dependency on a difference between VDD and VDDO; it can be used extensively without the voltage difference being a gating factor. As modern chip designs demand higher speed and lower power, this level-up shifter can be widely adopted for any interface that needs a rail-to-rail signal transition from one lower power supply domain to another higher power supply domain.

A further advantage of the level-up shifter circuit of FIG. 2 is in providing a wider range of difference between the two power domains. In contrast, in the circuit of FIG. 1, if the voltage difference between two domains grows larger, the signal driven from the lower voltage domain cannot completely shut off the devices in the higher voltage domain, therefore causes a DC path to ground. Moreover, the circuitry may completely lose its functionality if the voltage difference is so large that the devices at high voltage domain can't be shut off at all from the signals generated from lower voltage domain. The circuit of FIG. 2 avoids this problem, as it does not rely on the signal from the lower voltage domain to shut off the devices in the higher voltage domain. Rather, it implements a feedback mechanism driven from the higher voltage domain, which can completely eliminate the DC path to ground even given a wide range of difference between two voltage levels.

While this invention has been particularly shown and described with references to example embodiments thereof, it will be understood by those skilled in the art that various changes in form and details may be made therein without departing from the scope of the invention encompassed by the appended claims.

What is claimed is:

1. A level-up shifter circuit comprising:
a first buffer configured to receive an input signal in a first power domain;
first, second and third transistors connected in series between a source rail in a second power domain and ground rail, gates of the second and third transistors connected to the output of the first buffer, the second power domain being distinct from the first power domain;
second and third buffers connected in series, an output of the second buffer being connected to an input of the third buffer, an input of the second buffer being connected to a node between the second and third transistors, the third buffer outputting an output signal in the second power domain; and
fourth and fifth transistors having respective gates connected to the input signal and respective drains connected to a gate of the first transistor, the fourth transistor having a source continuously connected to a node between the second and third buffers.

2. The level-up shifter circuit of claim 1, wherein at least one of the first, second and third buffers include an inverter.

3. The level-up shifter circuit of claim 1, wherein the first buffer is configured to be powered by a power signal in the first power domain.

4. The level-up shifter circuit of claim 1, wherein the second and third buffers are configured to be powered by a power signal in the second power domain.

5. The level-up shifter circuit of claim 1, wherein the first power domain corresponds to a power domain of a central processing unit.

6. The level-up shifter circuit of claim 5, wherein the second power domain corresponds to a power domain of a communications bus for interfacing with the central processing unit.

7. The level-up shifter circuit of claim 1, wherein the third buffer maintains the output signal at a substantially constant duty cycle corresponding to a high-speed input signal.

8. The level-up shifter circuit of claim 1, wherein the third buffer maintains the output signal at a substantially constant duty cycle across substantial variations in process, voltage and temperature variations at the level-up shifter circuit.

9. The level-up shifter circuit of claim 1, wherein the level-up shifter is configured to minimize static current consumption when in an idle state.

10. A level-up shifter circuit comprising:
a first buffer configured to receive an input signal in a first power domain;
first, second and third transistors connected in series between a source rail in a second power domain and ground rail, gates of the second and third transistors connected to the output of the first buffer, the second power domain being distinct from the first power domain;

second and third buffers connected in series, an output of the second buffer being connected to an input of the third buffer, an input of the second buffer being connected to a node between the second and third transistors, the third buffer outputting an output signal in the second power domain; and fourth and fifth transistors having respective gates connected to the input signal and respective drains connected to a gate of the first transistor, the fourth transistor having a source connected to a node between the second and third buffers, the node being connected to the gate of the first transistor via the fourth transistor.

11. The level-up shifter circuit of claim 10, wherein at least one of the first, second and third buffers include an inverter.

12. The level-up shifter circuit of claim 10, wherein the first buffer is configured to be powered by a power signal in the first power domain.

13. The level-up shifter circuit of claim 10, wherein the second and third buffers are configured to be powered by a power signal in the second power domain.

14. The level-up shifter circuit of claim 10, wherein the first power domain corresponds to a power domain of a central processing unit.

15. The level-up shifter circuit of claim 14, wherein the second power domain corresponds to a power domain of a communications bus for interfacing with the central processing unit.

16. The level-up shifter circuit of claim 10, wherein the third buffer maintains the output signal at a substantially constant duty cycle corresponding to a high-speed input signal.

17. The level-up shifter circuit of claim 10, wherein the third buffer maintains the output signal at a substantially constant duty cycle across substantial variations in process, voltage and temperature variations at the level-up shifter circuit.

18. The level-up shifter circuit of claim 10, wherein the level-up shifter is configured to minimize static current consumption when in an idle state.

* * * * *